US009200826B2

(12) United States Patent
Sasaki (10) Patent No.: US 9,200,826 B2
(45) Date of Patent: Dec. 1, 2015

(54) COOLING SYSTEM, SUBSTRATE PROCESSING APPARATUS HAVING COOLING SYSTEM AND COOLING METHOD

(71) Applicant: Tokyo Electron Limited, Tokyo (JP)

(72) Inventor: Yasuharu Sasaki, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 272 days.

(21) Appl. No.: 13/774,122

(22) Filed: Feb. 22, 2013

(65) Prior Publication Data

US 2013/0219934 A1    Aug. 29, 2013

Related U.S. Application Data

(60) Provisional application No. 61/606,068, filed on Mar. 2, 2012.

(30) Foreign Application Priority Data

Feb. 23, 2012   (JP) .................................. 2012-037770

(51) Int. Cl.
| F28C 1/00 | (2006.01) |
|---|---|
| F28D 3/00 | (2006.01) |
| F28D 5/00 | (2006.01) |
| F25D 7/00 | (2006.01) |
| F25D 29/00 | (2006.01) |
| H01L 21/67 | (2006.01) |

(Continued)

(52) U.S. Cl.
CPC .. *F25D 7/00* (2013.01); *F25D 3/10* (2013.01); *F25D 29/00* (2013.01); *F25D 31/00* (2013.01); *H01L 21/67109* (2013.01); *H01L 21/67248* (2013.01)

(58) Field of Classification Search
CPC ............. F28C 3/08; F25D 7/00; F25D 29/00; H01L 21/304
USPC .................. 62/121, 171, 304; 261/87; 438/14
See application file for complete search history.

(56) References Cited

U.S. PATENT DOCUMENTS

| 4,424,680 A | * | 1/1984 | Rothchild | ....................... 62/46.1 |
| 5,156,006 A | * | 10/1992 | Broderdorf et al. | ........... 62/46.1 |

(Continued)

FOREIGN PATENT DOCUMENTS

| JP | 05-280842 A | 10/1993 |
| JP | 08-293479 A | 11/1996 |

(Continued)

*Primary Examiner* — Allen Flanigan
*Assistant Examiner* — Filip Zec
(74) *Attorney, Agent, or Firm* — Pearne & Gordon LLP (57) ABSTRACT

A cooling system can control a coolant temperature with a simple configuration. The cooling system 90 includes a vaporization vessel 80, a first fluid source 92, a first flow rate control unit 91, and a pressure control unit 99. The vaporization vessel 80 has a space, a supply opening 80a and a discharge opening 80b through which the coolant is supplied and discharged, respectively. The first fluid source 92 stores a first fluid having a vapor pressure higher than that of the coolant. The first flow rate control unit 91 connects the first fluid source 92 to the vaporization vessel 80 and controls a first fluid supply amount into the vaporization vessel. The pressure control unit 99 controls an internal pressure within the vaporization vessel to be higher than the vapor pressure of the coolant and equal to or lower than that of the first fluid.

7 Claims, 8 Drawing Sheets

(51) Int. Cl.
*F25D 3/10* (2006.01)
*F25D 31/00* (2006.01)

(56) References Cited

U.S. PATENT DOCUMENTS

| | | | |
|---|---|---|---|
| 5,996,975 A * | 12/1999 | Shin | 261/87 |
| 7,364,095 B2 * | 4/2008 | Hozumi | 236/94 |
| 7,582,491 B2 * | 9/2009 | Sasaki et al. | 438/14 |
| 7,618,027 B2 * | 11/2009 | Spiegelman | 261/130 |
| 8,016,271 B2 * | 9/2011 | Dulphy et al. | 261/87 |
| 8,025,097 B2 * | 9/2011 | Di Stefano et al. | 165/276 |
| 2004/0154641 A1 * | 8/2004 | Montierth | 134/3 |
| 2011/0180148 A1 * | 7/2011 | Xia et al. | 137/1 |

FOREIGN PATENT DOCUMENTS

| | | |
|---|---|---|
| JP | 2011-501429 A | 1/2011 |
| WO | 2009/051288 A1 | 4/2009 |

\* cited by examiner

COOLING SYSTEM, SUBSTRATE
PROCESSING APPARATUS HAVING
COOLING SYSTEM AND COOLING
METHOD

CROSS-REFERENCE TO RELATED
APPLICATION

This application claims the benefit of Japanese Patent Application No. 2012-037770 filed on Feb. 23, 2012, and U.S. Provisional Application Ser. No. 61/606,068 filed on Mar. 2, 2012, the entire disclosures of which are incorporated herein by reference.

FIELD OF THE INVENTION

The present disclosure relates to a cooling system, a substrate processing apparatus including the cooling system, and a cooling method.

BACKGROUND OF THE INVENTION

Conventionally, a cooling system for adjusting a temperature of a device or the like by circulating a liquid coolant has been known (see, for example, Patent Document 1). The cooling system described in Patent Document 1 includes a chiller and a heat exchanger. The cooling system supplies a circulating coolant to a primary coil of the heat exchanger and a low-temperature coolant generated in the chiller to a secondary coil of the heat exchanger to perform a cooling process through heat exchange therebetween.
Patent Document 1: Japanese Patent Laid-open Publication No. H08-293479

The cooling system described in Patent Document 1 may need a large-sized chiller or a long passageway for heat exchange depending on a required cooling temperature. Further, the heat exchanger or a line connecting the chiller to the heat exchanger needs to be heat-insulated. Thus, a size of the cooling system tends to increase depending on a required cooling temperature. In the art to which the present disclosure relates, there is demanded a cooling system and a cooling method capable of controlling a cooling temperature with a simple configuration.

BRIEF SUMMARY OF THE INVENTION

In accordance with one aspect of an illustrative embodiment, there is provided a cooling system of cooling a coolant. The cooling system includes a vaporization vessel having therein a space, a supply opening through which the coolant is supplied, and a discharge opening through which the coolant is discharged; a first fluid source configured to store therein a first fluid having a vapor pressure higher than a vapor pressure of the coolant; a first flow rate control unit configured, to connect the first fluid source to the vaporization vessel and to control a supply amount of the first fluid into the vaporization vessel; and a pressure control unit that is connected to the vaporization vessel and is configured to control an internal, pressure within the vaporization vessel to be higher than the vapor pressure of the coolant and equal to or lower than the vapor pressure of the first fluid.

In the cooling system, the first fluid having the vapor pressure higher than the vapor pressure of the coolant is supplied by the first flow rate control unit into the vaporization vessel to which the coolant is supplied, so that the first fluid is mixed with the coolant. Further, the internal pressure within the vaporization vessel is controlled to be higher than the vapor pressure of the coolant and equal to or lower than the vapor pressure of the first fluid by the pressure control unit. Accordingly, only the first fluid mixed with the coolant is vaporized within the vaporization vessel, so that the coolant is cooled by latent heat of the first fluid. Thus, the coolant can be cooled by mixing the first fluid having the vapor pressure higher than the vapor pressure of the coolant with the coolant and controlling the pressure. Therefore, a chiller and a heat exchanger are not needed, and a length of a passageway can be constant regardless of a required cooling temperature. Further, a line does not need to be heat-insulated. As a result it is possible to control a cooling temperature with a simple configuration.

In accordance with the illustrative embodiment, the cooling system may further include a temperature sensor configured to detect a temperature of the coolant within the vaporization vessel; and a controller that is connected to the temperature sensor and the pressure control unit and is configured to control the pressure control unit such that the internal pressure within the vaporization vessel is higher than the vapor pressure of the coolant and is equal to or lower than the vapor pressure of the first fluid based on the detected temperature of the coolant. With this configuration, the pressure can be controlled by the controller, so that the temperature of the coolant can be adjusted.

In accordance with the illustrative embodiment, the cooling system may further include a coolant flow rate control unit configured to control a flow rate of the coolant supplied into the vaporization vessel. Further, the controller may be further connected to the coolant flow rate control unit and the first flow rate control unit and be configured to control the supply amount of the first fluid based on a target temperature and the flow rate of the coolant. With this configuration, it is possible to determine how much heat energy is needed for cooling based on the target temperature and the flow rate of the coolant. Therefore, it is possible to determine and to control a required supply amount of the first fluid based on the latent heat of the first fluid.

In accordance with the illustrative embodiment, the cooling system may further include a second fluid source configured to store therein a second fluid having a vapor pressure higher than the vapor pressure of the first fluid; and a second flow rate control unit configured to connect the second fluid source to the vaporization vessel and to control a supply amount of the second fluid, into the vaporization vessel. Further, the controller may be further connected to the second flow rate control unit, and if a difference between the vapor pressure of the coolant and the vapor pressure of the first fluid at the temperature detected by the temperature sensor is equal to or lower than a certain value, the controller may control a flow rate of the second fluid based on the target temperature and the flow rate of the coolant. Furthermore, the controller may be configured to control the pressure control unit such that the internal pressure within the vaporization vessel is higher than the vapor pressure of the coolant and equal to or lower than the vapor pressure of the second fluid.

With this configuration, if a difference between the vapor pressure of the coolant and the vapor pressure of the first fluid is greater than the certain value, the first fluid is mixed with the coolant to be vaporized. If a difference between the vapor pressure of the coolant and the vapor pressure of the first fluid is equal to or lower than the certain value, the second fluid is mixed with the coolant to be vaporized. Therefore, if a pressure is controlled at a temperature range in which the vapor pressure of the coolant is close to the vapor pressure of the first fluid, it is possible to avoid an increase in accuracy required for pressure control by switching a fluid to the second fluid having the vapor pressure higher than the vapor pressure of the first fluid.

In accordance with the illustrative embodiment, the coolant may be a fluorine-based heat transfer medium, the first fluid may be water, and the second fluid may be liquid carbon dioxide or liquid nitrogen.

In accordance with another aspect of the illustrative embodiment, there is provided a substrate processing apparatus including the cooling system described above. The substrate processing apparatus includes a processing chamber configured to be evacuable and to accommodate a substrate; and a mounting table that is provided within the processing chamber and has therein a coolant flow path extended to an inlet and an outlet. Further, the supply opening and the discharge opening of the vaporization vessel are connected to the outlet and the inlet of the coolant flow path, respectively.

Further, in accordance with still another aspect of the illustrative embodiment, there is provided a cooling method of cooling a coolant. The cooling method includes supplying the coolant into a vaporization vessel having therein a space; mixing a first fluid having a vapor pressure higher than a vapor pressure of the coolant with the coolant in the vaporization vessel; and controlling an internal pressure within the vaporization vessel to be higher than the vapor pressure of the coolant and equal to or lower than the vapor pressure of the first fluid.

In accordance with the above-described substrate processing apparatus and the cooling method, same operation effects as the above-described cooling system can be obtained.

As explained above, in accordance with the illustrative embodiments, it is possible to control a cooling temperature with a simple configuration.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments will be described in detail with reference to the accompanying drawings. In each of drawings, parts having substantially same function and configuration will be assigned same reference numerals.

First Illustrative Embodiment

Figure 1:
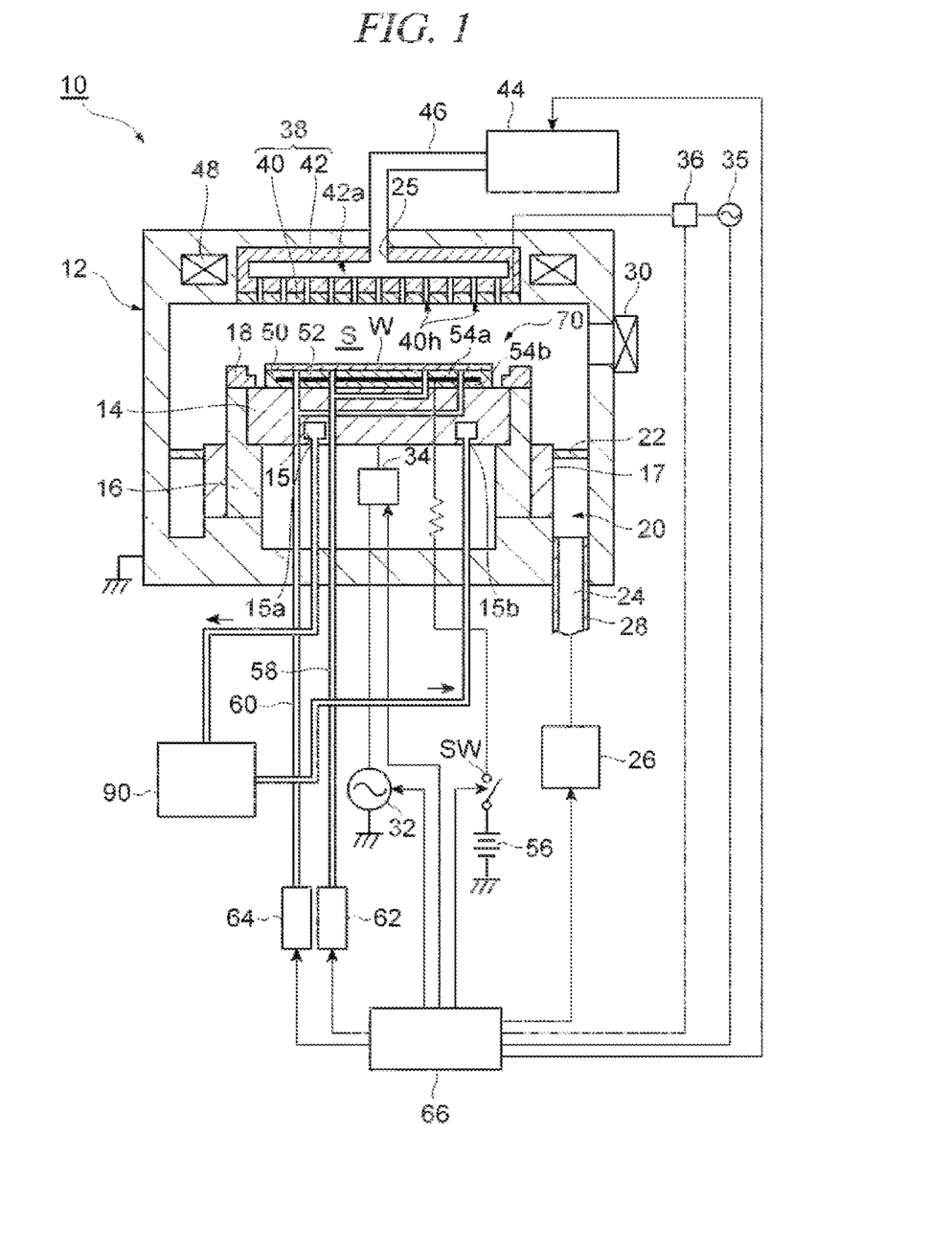
FIG. 1 is a schematic diagram of a configuration of a substrate processing apparatus in accordance with a first illustrative embodiment.

FIG. 1 is a schematic diagram of a plasma processing apparatus (substrate processing apparatus) in accordance with a first, illustrative embodiment. FIG. 1 shows a cross section of the plasma processing apparatus in accordance with the first illustrative embodiment. A plasma processing apparatus 10 depicted in FIG. 1 is a parallel plate type plasma processing apparatus.

The plasma processing apparatus 10 includes therein a processing chamber 12. The processing chamber 12 has a substantially cylindrical shape, and a processing space S as an inner space thereof is formed. The plasma processing apparatus 10 includes a substantially circular plate-shaped base 14 within the processing chamber 12. The base 14 is provided below the processing space S. The base 14 is made of, for example, aluminum and serves as a second electrode.

A coolant flow path 15 is provided within the base 14. The coolant flow path 15 is connected to a coolant inlet line and a coolant outlet line. An appropriate coolant, such as water or a fluorine-based heat transfer medium (Fluorinert (registered trademark) or Galden (registered trademark)), is circulated within the coolant flow path 15 by a cooling system 90. As a result, the base 14 and an electrostatic chuck 50 can be controlled to have a certain temperature.

In the first illustrative embodiment, the plasma processing apparatus 10 further includes a cylindrical holder 16 and a cylindrical support 17. The cylindrical holder 16 is in contact with peripheral portions of a side surface and a bottom surface of the base 14 to hold the base 14. The cylindrical support 17 is extended in a vertical direction from a bottom portion of the processing chamber 12 and supports the base 14 via the cylindrical holder 16. The plasma processing apparatus 10 farther includes a focus ring 18 provided on an upper surface of the cylindrical holder 16. The focus ring 18 may be made of, for example, silicon or quartz.

In the first illustrative embodiment, an exhaust path 20 is formed between a sidewall of the processing chamber 12 and the cylindrical support 17. A baffle plate 22 is provided at an inlet of the exhaust path 20 or on its way. An exhaust opening 24 is formed at a bottom portion of the exhaust path 20. The exhaust opening 24 is formed by inserting an exhaust pipe 28 into the bottom portion of the processing chamber 12. The exhaust pipe 28 is connected to an exhaust device 26. The exhaust device 26 includes a vacuum pump, so that the processing space S within the processing chamber 12 can be depressurized to a certain vacuum level. At the sidewall of the processing chamber 12, there is provided a gate valve 30 configured to open and close a loading/unloading opening through which, a target substrate W is transferred.

The base 14 is electrically connected to a high frequency power supply 32 for plasma generation via a matching unit 34. The high, frequency power supply 32 applies a high frequency power of a certain high frequency (for example, about 27 MHz or more) to the second electrode, i.e. the base 14.

The plasma processing apparatus 10 further includes a shower head 38 within the processing chamber 12. The shower head 38 is provided above the processing space S. The shower head 38 includes an electrode plate 40 and an electrode supporting body 42.

The electrode plate 40 is a conductive plate having a substantially circular place shape and serves as a first electrode. The electrode plate 40 is electrically connected to a high frequency power supply 35 for plasma generation via a matching unit 36. The high frequency power supply 35 applies a high frequency power of a certain high frequency (for example, about 27 MHz or more) to the electrode plate 40. If the high frequency power supply 32 and the high frequency power supply 35 apply high frequency powers to the base 14 and the electrode plate 40, respectively, a high frequency electric field is formed in a space, i.e. the processing space S, between the base 14 and the electrode plate 40.

The electrode plate 40 includes multiple gas through holes 40*h*. The electrode plate 40 is detachably attached to and supported by the electrode supporting body 42. Within the electrode supporting body 42, there is provided a buffer room 42*a*. The plasma processing apparatus 10 further includes a gas supply unit 44. A gas inlet opening 25 of the buffer room 42*a* is connected to the gas supply unit 44 via a gas supply pipe 46. The gas supply unit 44 supplies a processing gas to the processing space S. The gas supply unit 44 may supply, for example, a CF-based etching gas. The electrode supporting body 42 includes multiple holes connected to the multiple gas through holes 40*h*, respectively. The multiple holes communicate with the buffer room 42*a*. Therefore, the gas supplied from the gas supply unit 44 is supplied to the processing space S through the buffer room 42*a* and the gas through holes 40*h*.

In the first illustrative embodiment, there is provided a magnetic field forming unit 48 extended annularly or concentrically at a ceiling of the processing chamber 12. The magnetic field forming unit 48 is configured to efficiently start high frequency electric discharge (plasma ignition) in the processing space S and stably maintain the electric discharge.

In the first illustrative embodiment, the electrostatic chuck 50 is provided on an upper surface of the base 14. The electrostatic chuck 50 includes an electrode 52 and a pair of insulating films 54*a* and 54*b*. The insulating films 54*a* and 54*b* are made of an insulating material such as ceramic. The electrode 52 is a conductive film, and provided between the insulating film 54*a* and the insulating film 54*b*. The electrode 52 is connected to a DC power supply 56 via a switch SW. If a DC voltage is applied from the DC power supply 56 to the electrode 52, a Coulomb force is generated. The target substrate W is attracted to and held on the electrostatic chuck 50 by the Coulomb force. A mounting table 70 includes the base 14 and the electrostatic chuck 50.

In the first illustrative embodiment, the plasma processing apparatus 10 further includes gas supply lines 58 and 60 and includes heat transfer gas supply units 62 and 64. The heat transfer gas supply unit 62 is connected, to the gas supply line 58. The gas supply line 58 is extended to an upper surface of the electrostatic chuck 50 and extended annularly at a central portion of the upper surface thereof. The heat transfer gas supply unit 62 supplies a heat transfer gas such as a He gas between the upper surface of the electrostatic chuck 50 and the target substrate W. Further, the heat transfer gas supply unit 64 is connected to the gas supply line 60. The gas supply line 60 is extended to the upper surface of the electrostatic chuck 50 and extended annularly at the upper surface to surround the gas supply line 58. The heat transfer gas supply unit 64 supplies a heat transfer gas such as a He gas between the upper surface of the electrostatic chuck 50 and the target substrate W.

In the first illustrative embodiment, the plasma processing apparatus 10 further includes a controller 66. The controller 66 is connected to the exhaust device 26, the switch SW, the high frequency power supply 32, the matching unit 34, the high frequency power supply 35, the matching unit 36, the gas supply unit 44, and the heat transfer gas supply units 62 and 64. The controller 66 transmits control signals to the exhaust, device 26, the switch SW, the high frequency power supply 32, the matching unit 34, the high frequency power supply 35, the matching unit 36, the gas supply unit 44, and the heat transfer gas supply units 62 and 64, respectively. Exhaust by the exhaust device 26, opening and closing of the switch SW, power supply from the high frequency power supply 32, impedance control of the matching unit 34, power supply from the high frequency power supply 35, impedance control of the matching unit 36, processing gas supply from the gas supply unit 44, and heat transfer gas supply from the heat transfer gas supply units 62 and 64 are controlled in response to the control signals from the controller 66.

In the plasma processing apparatus 10, a processing gas is supplied from the gas supply unit 44 into the processing space S. Further, a high frequency electric field is formed between the electrode plate 40 and the base 14, i.e. in the processing space S. Thus, plasma is generated in the processing space S and the target substrate W is etched, e.g., by radicals (for example, oxygen radicals) of elements contained in the processing gas.

Figure 2:
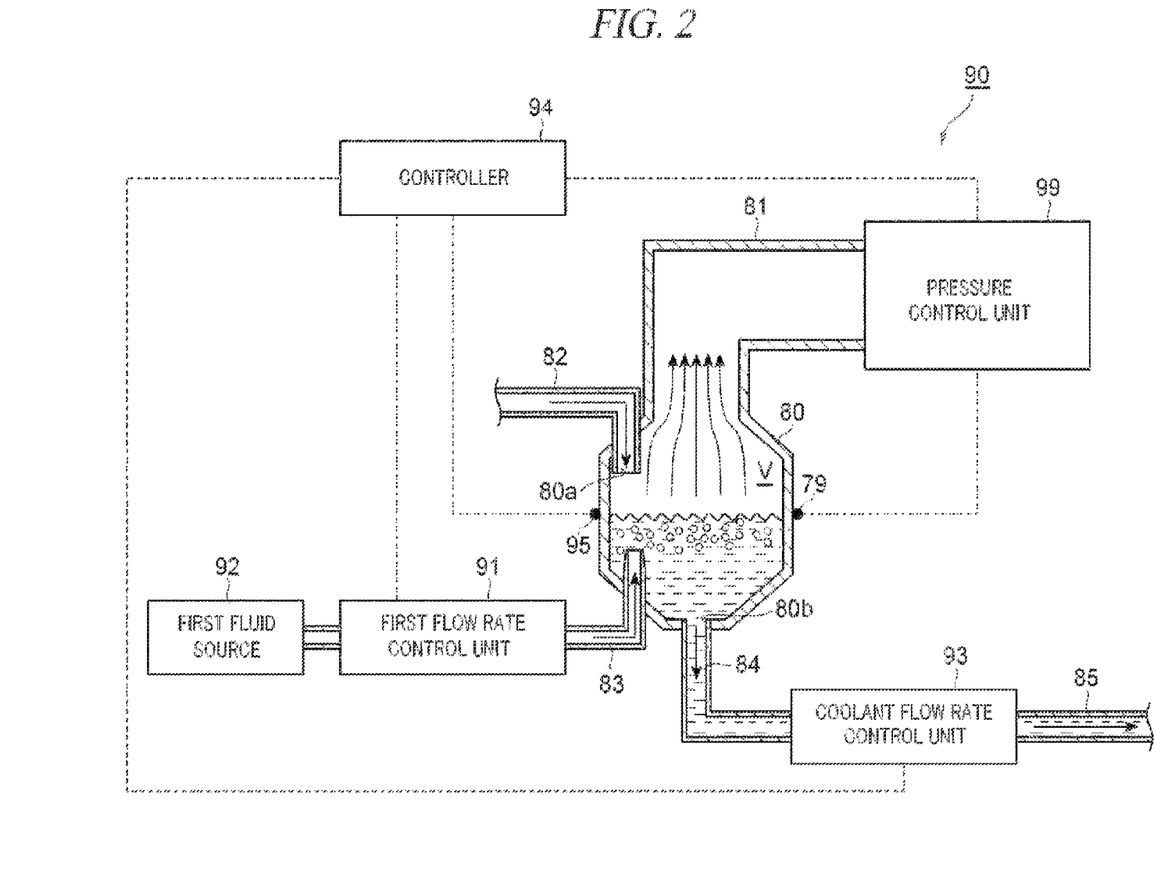
FIG. 2 is a schematic diagram of a cooling system depicted in FIG. 1.

FIG. 2 is a schematic diagram illustrating a configuration of the cooling system 90. As depicted in FIG. 2, the cooling system 90 includes a vaporization vessel 80, a first fluid source 92, a first flow rate control, unit 91, and a pressure control unit 99.

The vaporization vessel 80 includes therein a space V. The vaporization vessel 80 includes a supply opening 80*a* through which, a coolant is supplied. The supply opening 80*a* is connected to an outlet 15*a* of the coolant, flow path 15 depicted in FIG. 1 through a line 62. Further, the vaporization vessel 80 includes a discharge opening 80*b* through which the coolant is discharged. The discharge opening 80*b* is connected to an inlet 15*b* of the coolant flow path 15 depicted in FIG. 1 through lines 84 and 85. Thus, the coolant within the coolant flow path 15 is supplied to the vaporization vessel 80 through the line 82, and then, the processed coolant is discharged from the vaporization vessel 80 and returned to the coolant flow path 15 through the lines 84 and 85, which forms a circulation path. Between the discharge opening 80*b* and the inlet 15*b* of the coolant flow path 15, there is provided a coolant flow rate control unit 93 configured to control a flow rate of the coolant discharged into the circulation path. The coolant flow rate control unit 93 is formed, of, for example, an electric valve and a pump. Since the coolant is circulated by the coolant flow rate control unit 93, the coolant flow-rate control unit 93 may adjust a supply amount of the coolant to the vaporization vessel 80 as well as a discharge amount of the coolant from the vaporization vessel 80.

The vaporization vessel 80 is connected to the first fluid source 92 via the first flow rate control unit 91. The first fluid source 92 stores a first fluid having a vapor pressure higher than that of the coolant. By way of example, if the coolant is water, liquid carbon dioxide or liquid nitrogen may be used as the first fluid, and if the coolant is a fluorine-based heat transfer medium, water, liquid carbon dioxide or liquid nitrogen may be used as the first fluid.

The first flow rate control unit 91 is provided between the first fluid source 92 and the vaporization vessel 80. The first flow rate control unit 91 connects the first fluid source 92 to the vaporization vessel 80 and controls a supply amount of the first fluid into the vaporization vessel 80. The first flow rate control unit 91 includes, for example, an electric valve and a flow rate controller.

The vaporization vessel 80 is connected to the pressure control unit 99 configured to control an internal pressure within the vaporization vessel 80. By way of example, a depressurizable vacuum pump may be used, as the pressure control, unit 99. The pressure control unit 99 may control an internal pressure within the vaporization vessel 80 based on a detection value of a pressure sensor 79 connected to the pressure control unit 99. Further, the vaporization vessel 80 includes a temperature sensor 95 configured to detect a temperature of the coolant within the vaporization vessel 80.

The cooling system 90 further includes a controller 94. The controller 94 is an electronically controllable computer formed of a CPU, a storage medium, and an input/output interface. The controller 94 is connected to the coolant flow rate control unit 93, the first flow rate control unit 91, the temperature sensor 95, and the pressure control unit 99. The controller 94 transmits control signals to the coolant flow rate control unit 93, the first flow rate control unit 91, and the pressure control unit 99, respectively. Transfer of the coolant by the coolant flow rate control unit 93, supply of the first fluid by the first flow rate control unit 91, and the internal pressure within the vaporization vessel 80 by the pressure control unit 99 are controlled in response to the control signals from the controller 94. The above-described controller 66 may serve as the controller 94.

Figure 3:
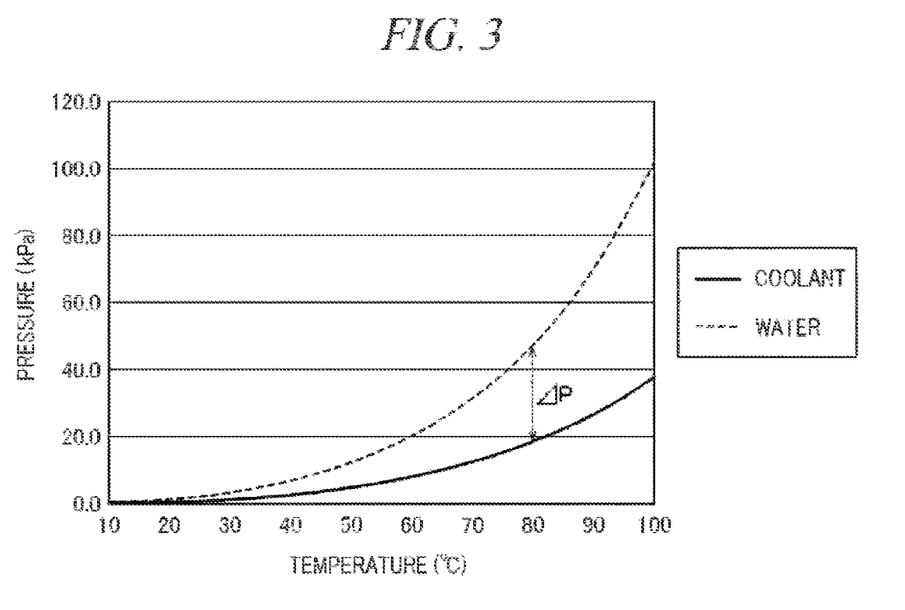
FIG. 3 shows vapor pressure carves of a coolant and water.

The controller 94 is configured to refer to property information (vapor pressure characteristic or the like) of the coolant and property information (vapor pressure characteristic, latent heat or the like) of the first fluid which are stored in the storage medium. Further, the controller 94 is configured to refer to a set temperature (target temperature) stored in the storage medium or a set temperature (target temperature) inputted from the input/output interface. Furthermore, the controller 94 operates the pressure control unit 99 such that the internal pressure within the vaporization vessel 80 is higher than a vapor pressure of the coolant and equal to or lower than a vapor pressure of the first fluid based on a temperature detected by the temperature sensor 95. To be specific, based on a temperature detected, by the temperature sensor 95 and the vapor pressure characteristic stored in the storage medium, the controller 94 specifies a vapor pressure of the coolant and a vapor pressure of the first fluid at this temperature. Then, the controller 94 controls the pressure control unit 99 such that the internal pressure within the vaporization vessel 80 is higher than the vapor pressure of the coolant and equal to or lower than the vapor pressure of the first fluid. FIG. 3 shows vapor pressure curves of water as the first fluid and a coolant having a vapor-pressure lower than that of the water. A horizontal axis thereof represents a temperature and a vertical axis thereof represents a pressure. As depicted in FIG. 3, if a temperature detected by the temperature sensor 95 is about 30° C., the coolant is vaporized when the internal pressure within the vaporization vessel 80 is equal to or lower than about 20 kPa while the water is vaporized when the internal pressure within the vaporization vessel 80 is equal to or lower than about 45 kPa. That is, by controlling the internal pressure within the vaporization vessel 80 to be in a range of a pressure difference ΔP between the coolant and the first fluid at a certain temperature, only the first fluid can be vaporized without vaporizing the coolant. In other words, the coolant can be cooled by using latent heat of the first fluid.

The controller 94 may control a supply amount of the first fluid based on a target temperature and a flow rate of the coolant. By way of example, the controller 94 calculates how much heat energy is needed (or how much heat energy needs to be lost) to reach a target temperature based on a temperature detected by the temperature sensor 95 and a transfer amount (flow rate of the coolant) of the coolant flow rate control unit 93. Then, the controller 94 calculates a flow rate of the first fluid required to obtain the calculated amount of heat energy based on the latent heat of the first fluid stored in the storage medium. Thereafter, the controller 94 outputs a signal to the first flow rate control unit 91 to control the calculated flow rate of the first fluid.

TABLE 1

|  | Latent heat (KJ/kg) | Required flow rate (lpm) |
|---|---|---|
| Water | 2500 | 0.77 |
| Liquid $CO_2$ | 573.5 | 3.23 |
| Liquid $N_2$ | 198.6 | 9.35 |

Table 1 shows an example of property information (latent heat [KJ/kg]) of the first fluid. A required flow rate [lpm] of the first fluid can be calculated by using the latent heat shown in Table 1. Table 1 shows a flow rate required for a case, for example, where a temperature of the coolant is set to be from about 80° C. to about 30° C.

Figure 4:
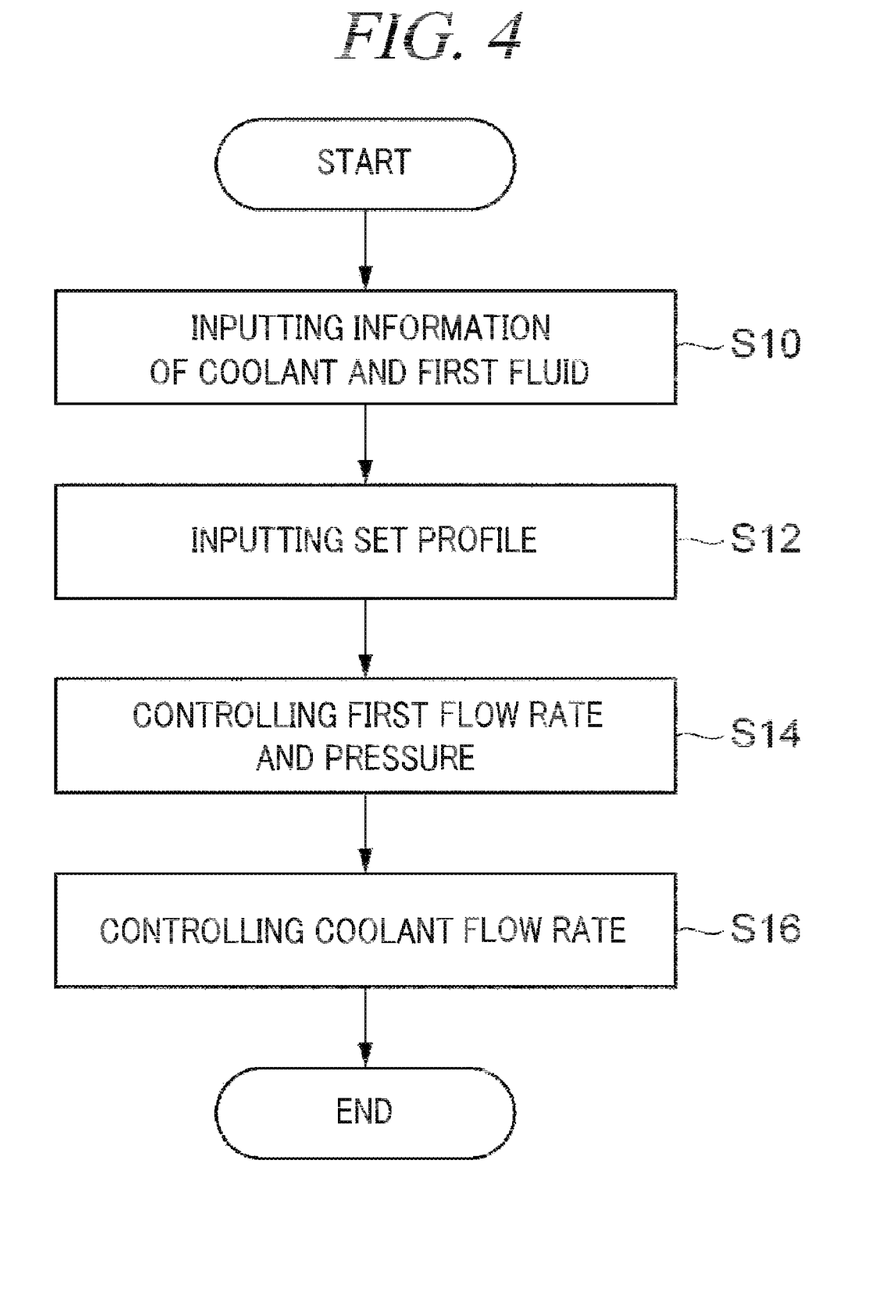
FIG. 4 is a flow chart for explaining a cooling operation of the cooling system depicted in FIG. 2.

Hereinafter, an operation (cooling method) of the cooling system 30 will be explained. FIG. 4 is a flow chart for explaining the operation of the cooling system 90. The operation shown in FIG. 4 is performed by the controller 94. Above all, information of the coolant, and the first fluid is inputted (S10). In the process of S10, the controller 94 inputs the information with reference to the property information (vapor pressure characteristic or the like) of the coolant and the property information (vapor pressure characteristic, latent heat or the like) of the first fluid which are stored in the storage medium. Then, the controller 94 inputs a set profile (set temperature of the coolant) (S12). By way of example, the controller 94 inputs a set temperature (target temperature) stored in the storage medium.

Then, the controller 94 performs a first flow rate control and a pressure control (S14). The controller 94 calculates a first flow rate required to reach the set temperature based on the detection temperature of the temperature sensor 95, and the set temperature and the latent heat of the first fluid stored in the storage medium. Then, the controller 94 outputs a signal to the first flow rate control unit 91. Further, the controller 94 calculates a pressure difference (pressure range) ΔP in which only the first fluid is vaporized based on the detection temperature of the temperature sensor 95, and the set temperature, the vapor pressure characteristic of the coolant, and the vapor pressure characteristic of one first fluid, stored in the storage medium. Then, the controller 94 outputs a signal to the pressure control unit 99. Thus, the first fluid is vaporized and heat of the coolant is lost to perform, a cooling process.

Thereafter, the controller 94 controls the vaporization of S14 and a required supply amount to the coolant flow path 15, and outputs a signal to the coolant flow rate control unit 93 (S16). When the process of S16 is ended, the control process shown in FIG. 4 is ended.

Figure 7:
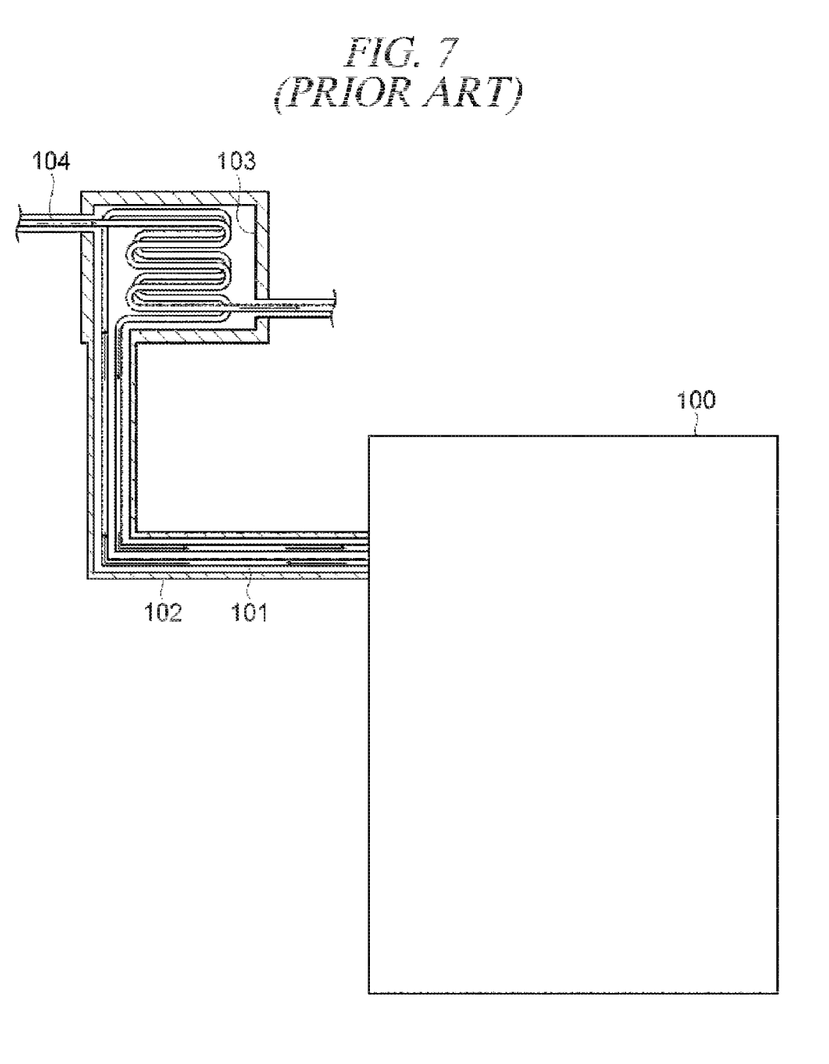
FIG. 7 is a schematic diagram for explaining a configuration of a conventional cooling system.

By performing the control process as shown in FIG. 4, the fluid mixed with the coolant is vaporized, in the vaporization vessel 80 and heat of the coolant is lost. As a result, the coolant is cooled to the set temperature. Meanwhile, in a conventional cooling system, a chiller for cooling is needed. FIG. 7 is a schematic diagram of the conventional cooling system. The conventional cooling system shown in FIG. 7 includes a chiller 100 and a heat exchanger 103. The chiller 100 is connected to a cooling line 101 and cools a coolant within a coolant line 104. The heat exchanger 103 accommodates the coolant line 104 as a cooling target and the cooling line 101. In the conventional cooling system, the large-sized chiller 100 is needed to maintain a low temperature equal to or lower than a required cooling temperature. Further, the heat exchanger 103 and a line connecting the chiller 100 to the heat exchanger 103 need to be covered with a heat insulating member 102. Furthermore, it is required to set a passageway for heat exchange to be long within the heat exchanger 103.

Figure 8:
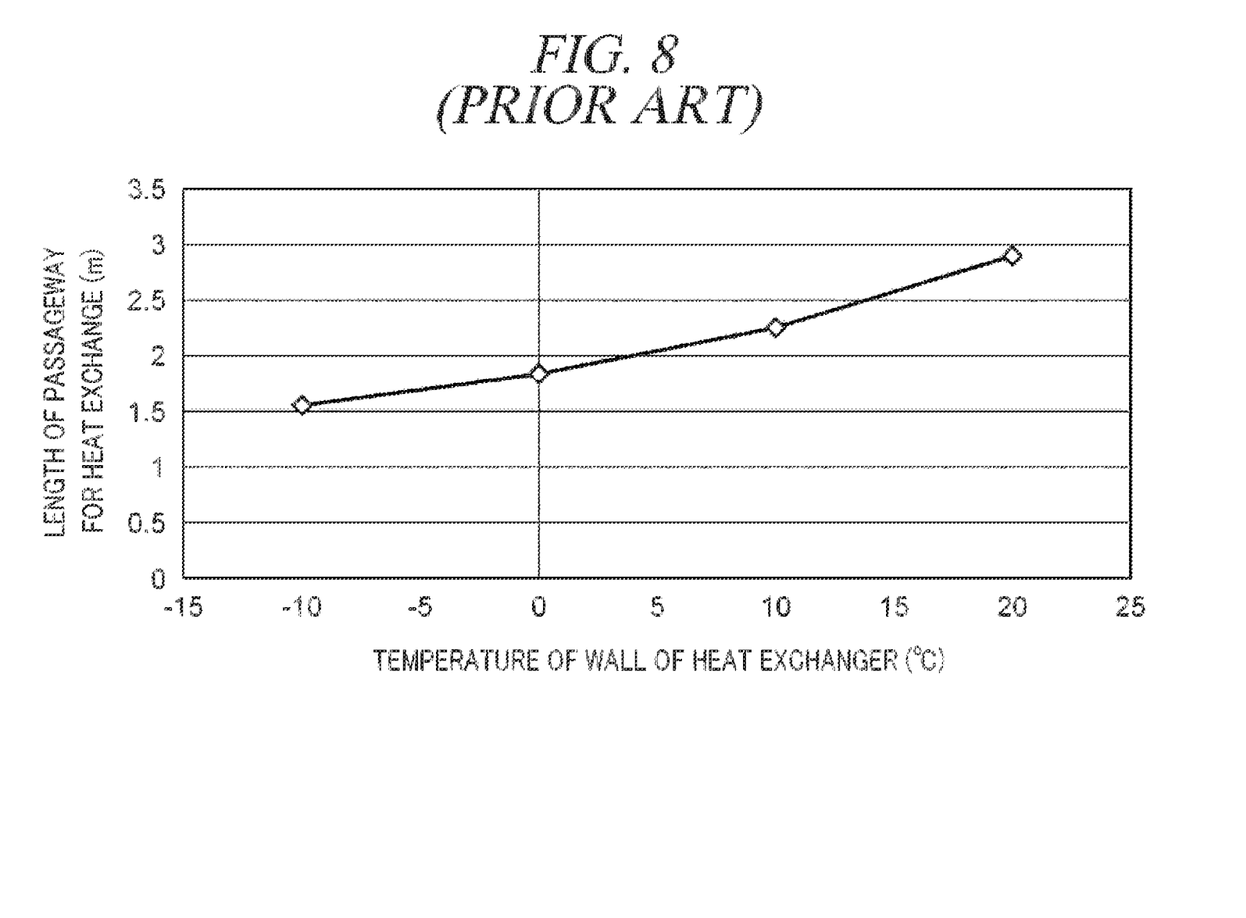
FIG. 8 shows a graph for explaining a length of a passageway required for the conventional cooling system.

By way of example, in a heat exchange structure depicted, in FIG. 7, a calculated length of the passageway required for cooling a coolant of about 80° C. to about 30° C. is shown in a graph of FIG. 8. In FIG. 8, a horizontal, axis thereof represents a temperature of the heat exchanger 103 and a vertical axis thereof represents a length of the passageway for heat exchange. Further, in FIG. 8, the calculation is made under the condition that heat transfer coefficient of a wall of the heat exchanger 103 is about 5000 [$W/m^2 \cdot K$], an inner diameter of the cooling line 101 of the heat exchanger 103 is about 0.02 [m], a flow rate of the coolant is about 20 [lpm], specific heat of the coolant is about 1053 [$J/kg \cdot K$], (and density of the coolant is about 1817 [$kg/m^3$]. The heat conductivity of the wall of the heat exchanger 103 is uniform within the passageway, a temperature of an outer wall of the heat exchanger 103 is constant (i.e. a chiller of about 40 kW is additionally provided and completely heat-insulated), and the flow rate is uniform regardless of the length of the passageway (i.e. a pump capable of acquiring a sufficient flow rate is provided and the heat exchanger 103 has sufficient strength not to be damaged by a liquid pressure). By way of example, as shown in FIG. 8, even if a temperature of the wall of the heat exchanger 103 is about −10° C., the passageway needs to be about 15 m in length, and if a temperature of the wall of the heat exchanger 103 is about 20° C., the passageway needs to be about 3.0 m in length. Thus, the cooling system may be scaled up in size.

In the conventional cooling system, a heat capacity of the coolant is large, and, thus, it is difficult to rapidly control a temperature. Further, in the conventional cooling system, since heat is transferred by bringing the heat exchanger 103 in contact with the coolant, a flow of a high flow velocity is needed in the heat exchanger 103. Therefore, a pressure within the line tends to increase. In particular, it is more inefficient to adjust a temperature by cooling than to adjust a temperature by heating.

However, a large-sized chiller or a heat-insulated structure is not required, for the cooling system 90 in accordance with the first illustrative embodiment. A size of the vaporization vessel 80 can be changed freely regardless of a temperature. For this reason, the cooling system can be scaled down in size.

In the cooling system 90 in accordance with the first illustrative embodiment, since heat exchange is not performed by contacting, there is no need to increase a flow velocity. As a result, an internal pressure within a flow path is not increased. Further, since heat is lost by vaporization, it is easy to adjust a temperature by cooling. Since a vaporization rate can be controlled based on a surface area of the coolant or a pressure difference within the vaporization vessel 80, it is possible to rapidly reach a target temperature. If vaporization is made, a cooling process must be performed by the latent heat. Therefore, a temperature of the coolant can be accurately adjusted by accurately adjusting a flow rate of the first fluid. The cooling system 90 has various effects in a high responsiveness, a follow-up property to a target temperature, and an appropriate temperature control by cooling. Accordingly, the cooling system 90 can be properly used for, particularly, cooling the mounting table of the substrate processing apparatus.

Second Illustrative Embodiment

A cooling system 90 in accordance with a second illustrative embodiment is substantially the same as the cooling system 90 in accordance with the first illustrative embodiment except that a second fluid is prepared in addition to the first, fluid and fluids to be mixed with a coolant are switched. Hereinafter, descriptions of parts overlapped with the first illustrative embodiment will be omitted but parts different from the first illustrative embodiment will be described.

Figure 5:
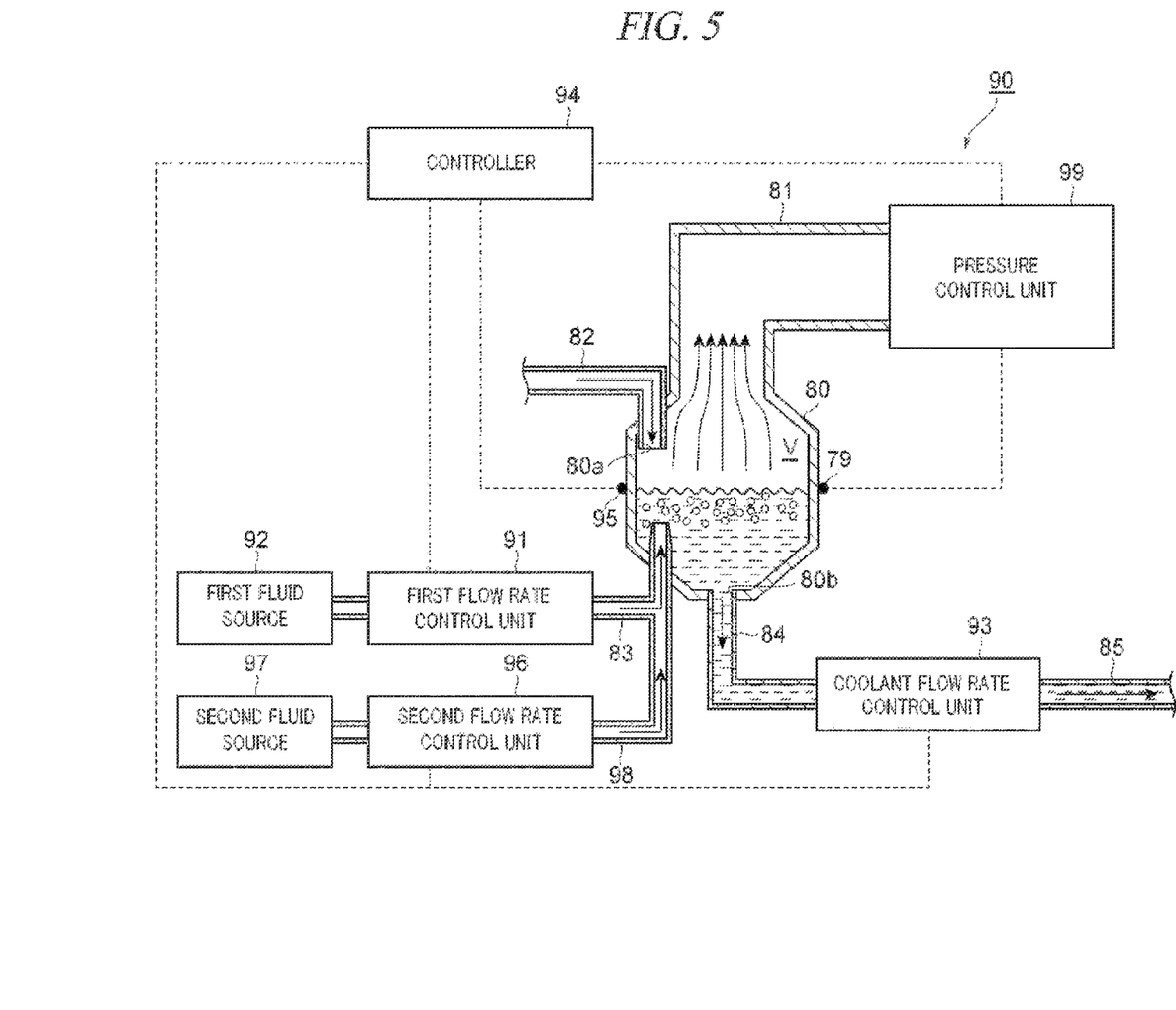
FIG. 5 is a schematic diagram of a cooling system in accordance with a second illustrative embodiment.

FIG. 5 is a schematic diagram illustrating a configuration of the cooling system 90 in accordance with the second illustrative embodiment. As depicted in FIG. 5, the cooling system 90 has substantially the same configuration as the cooling system 90 in accordance with the first illustrative embodiment except that a second fluid source 97 and a second flow rate control unit 96 are additionally provided.

A vaporization vessel 80 is connected to the second fluid source 97 via the second flow rate control unit 96 and a line 98. The second fluid source 97 stores therein a second fluid having a vapor pressure higher than that of a first fluid. By way of example, if a coolant is fluorine-based heat transfer medium, and the first fluid is water, liquid carbon dioxide or liquid nitrogen may be used as the second fluid.

The second flow rate control unit 96 is provided between the second fluid source 97 and the vaporization vessel 80. The second flow rate control unit 96 connects the second fluid source 97 to the vaporization vessel 80 and is configured to control a supply amount of the second fluid into the vaporization vessel 80. The second, flow rate control unit 96 includes, for example, an electric valve and a flow rate controller.

A controller 94 is connected to the second flow rate control unit 96. Further, the controller 94 is configured to refer to property information (vapor pressure characteristic, latent heat or the like) of the second fluid. Furthermore, the controller 94 operates a pressure control unit 99 such that an internal pressure within the vaporization vessel 80 is higher than a vapor pressure of the coolant and equal to or lower than a vapor pressure of the second fluid based on a temperature detected by the temperature sensor 95. To be specific, based on a temperature detected by the temperature sensor 95 and the vapor pressure characteristic stored in the storage medium, the controller 94 specifies a vapor pressure of the coolant and a vapor pressure of the second fluid at this temperature. Then, the controller 94 controls the pressure control unit 99 such that the internal pressure within the vaporization vessel 80 is higher than the vapor pressure of the coolant and equal to or lower than the vapor pressure of the second fluid.

The controller 94 may control a supply amount of the second fluid based on a target temperature and a flow rate of the coolant. By way of example, the controller 94 calculates how much heat energy is needed (or how much heat energy needs to be lost) to reach a target temperature based on a temperature detected by the temperature sensor 95 and a transfer amount (flow rate of the coolant) of a coolant flow rate control unit 93. Then, the controller 94 calculates a flow rate of the second fluid required to obtain the calculated amount of heat energy based on the latent heat of the second fluid stored in the storage medium, and outputs a signal to the second flow rate control unit 96 to control the calculated flow rate of the second fluid. Except this difference, the configuration is the same as described, in the first illustrative embodiment.

Figure 6:
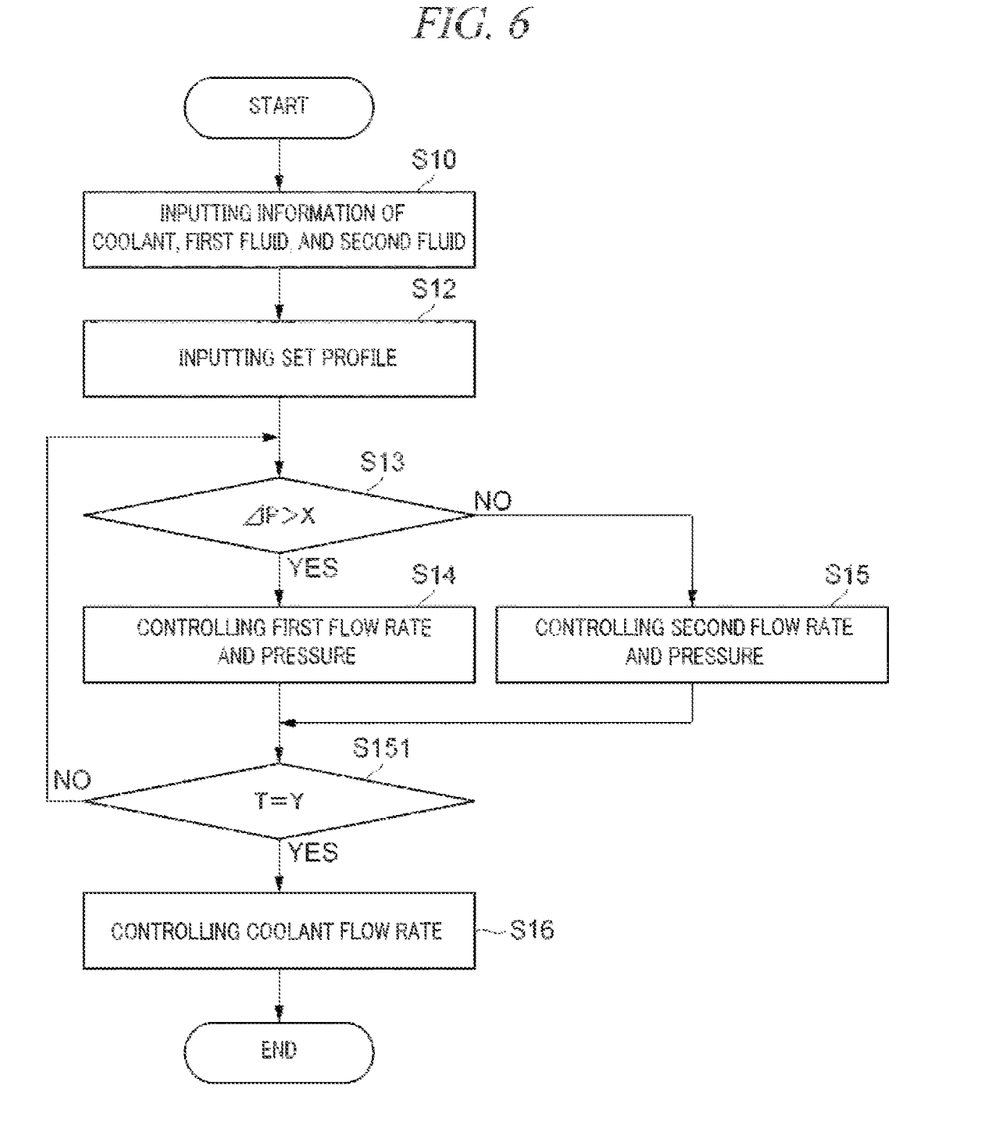
FIG. 6 is a flow chart for explaining a cooling operation of the cooling system depicted in FIG. 5.

Hereinafter, an operation (cooling method) of the cooling system 90 will be explained. FIG. 6 is a flow chart for explaining the operation of the cooling system 90. The operation shown in FIG. 6 is performed by the controller 94. Above all, information of the coolant, the first fluid and the second fluid is inputted (S10). In the process of S10, the controller 94 inputs the information with reference to the property information (vapor pressure characteristic or the like) of the coolant, and the property information (vapor pressure characteristic, latent heat, or the like) of the first fluid and the second fluid which are stored in the storage medium. Then, the controller 94 inputs a set profile (set temperature of the coolant) (S12). By way of example, the controller 94 inputs a set temperature (target temperature) stored in the storage medium.

Then, the controller 94 calculates a pressure difference (pressure range) ΔP in which only the first fluid is vaporized based on the detection temperature of the temperature sensor 95, and the set temperature, the vapor pressure characteristic of the coolant, and the vapor pressure characteristic of the first fluid stored in the storage medium. Thereafter, the controller 94 determines whether ΔP is higher than a certain value X (S13). By way of example, the certain value X may be determined based on pressure control accuracy of the pressure control unit 99. By way of example, if the pressure control accuracy of the pressure control unit 99 is about ±1 [kPa], the certain value X may be greater (for example, about 3 [kPa]) than the pressure control accuracy. Here, the certain value X needs to be equal to or higher than 0.

In the process of S13, if it is determined that ΔP is higher than the certain value X, the controller 94 performs the first flow rate control and the pressure control (S14). This process is the same as the process of S14 shown in FIG. 4. When the process of S14 is ended, a temperature determination process is performed (S151). In the process of S151, the controller 94 determines whether a detection temperature T of the temperature sensor 95 is equal to a target, temperature Y. In one process of S151, if it is determined that the detection temperature T is not equal to the target temperature Y, the process of S13 is performed again. Thus, the processes of S13 and S14 or the following process of S15 is repeatedly performed until the detection temperature T reaches to the target temperature Y.

Meanwhile, in the process of S13, if it is determined that ΔP is not higher (i.e. equal to or lower) than the certain value X, the controller 94 performs a second flow rate control and the pressure control (S15). The controller 94 calculates a second flow rate required to reach the set temperature based on the detection temperature of the temperature sensor 95, and the set temperature and the latent heat of the second fluid stored in the storage medium. Then, the controller 94 outputs a signal to the second flow rate control unit 96. Further, the controller 94 calculates a pressure difference (pressure range) ΔP in which only the second fluid is vaporized based on the detection temperature of the temperature sensor 95, and the set temperature, the vapor pressure characteristic of the coolant, and the vapor pressure characteristic of the second fluid stored in the storage medium. Then, the controller 94 outputs a signal to the pressure control unit 99. Thus, the second fluid is vaporized and heat of the coolant is lost to perform the cooling process. When the process of S15 is ended, the temperature determination process is performed (S151).

In the process of S151, if it is determined that the detection temperature T is equal to the target temperature Y, a coolant flow rate control process is performed (S16). This process is the same as the process of S16 shown in FIG. 4. When the process of S16 is ended, the control process shown in FIG. 6 is ended.

By performing the control process as shown, in FIG. 6, the first fluid mixed with the coolant is vaporized in the vaporization vessel 80 and heat of the coolant is lost. As a result, the coolant is cooled to the set temperature. Further, if the pressure difference ΔP between the vapor pressure of the coolant and the vapor pressure of the first fluid is higher than the certain value X, the first fluid is mixed with the coolant and vaporized. If the pressure difference ΔP is equal to or lower than the certain value X, the second fluid is mixed with the coolant and vaporized. If a pressure is controlled in a temperature range in which the vapor pressure of the coolant is close to the vapor pressure of the first fluid, the pressure control needs to be performed with sufficient accuracy. By switching a fluid to be mixed with the coolant to the second fluid having the vapor pressure higher than that of the first fluid, it is possible to avoid an increase in accuracy required for pressure control.

The above-described illustrative embodiments do not limit the present disclosure. By way of example, a sequence of the processes of S10 and S12 shown in FIGS. 4 and 6 may be reversed.

What is claimed is:

1. A cooling system of cooling a coolant, the cooling system comprising:
    a vaporization vessel having therein a space, a supply opening through which the coolant is supplied, and a discharge opening through which the coolant is discharged;
    a first fluid source configured to store therein a first fluid having a vapor pressure higher than a vapor pressure of the coolant;
    a first flow rate control unit configured to connect the first fluid source to the vaporization vessel and to control a supply amount of the first fluid into the vaporization vessel;
    a pressure control unit that is connected to the vaporization vessel and is configured to control an internal pressure within the vaporization vessel to be higher than the vapor pressure of the coolant and equal to or lower than the vapor pressure of the first fluid;
    a second fluid source configured to store therein a second fluid having a vapor pressure higher than the vapor pressure of the first fluid; and
    a second flow rate control unit configured to connect the second fluid source to the vaporization vessel and to control a supply amount of the second fluid into the vaporization vessel.

2. The cooling system of claim 1, further comprising:
    a temperature sensor configured to detect a temperature of the coolant within the vaporization vessel; and
    a controller that is connected to the temperature sensor and the pressure control unit and is configured to control the pressure control unit such that the internal pressure within the vaporization vessel is higher than the vapor pressure of the coolant and is equal to or lower than the vapor pressure of the first fluid based on the detected temperature of the coolant.

3. The cooling system of claim 2, further comprising:
    a coolant flow rate control unit configured to control a flow rate of the coolant supplied into the vaporization vessel,
    wherein the controller is further connected to the coolant flow rate control unit and the first flow rate control unit and is configured to control the supply amount of the first fluid based on a target temperature and the flow rate of the coolant.

4. The cooling system of claim 3,
    wherein the controller is further connected to the second flow rate control unit, and if a difference between the vapor pressure of the coolant and the vapor pressure of the first fluid at the temperature detected by the temperature sensor is equal to or lower than a predetermined value, the controller controls a flow rate of the second fluid based on the target temperature and the flow rate of the coolant, and
    the controller is configured to control the pressure control unit such that the internal pressure within the vaporization vessel is higher than the vapor pressure of the coolant and equal to or lower than the vapor pressure of the second fluid.

5. The cooling system of claim 4,
wherein the coolant is a fluorine-based heat transfer medium,
the first fluid is water, and
the second fluid is liquid carbon dioxide or liquid nitrogen.

6. A substrate processing apparatus including the cooling system of claim 1, the substrate processing apparatus comprising:
　a processing chamber configured to be evacuable and to accommodate a substrate; and
　a mounting table that is provided within the processing chamber and has therein a coolant flow path extended to an inlet and an outlet,
　wherein the supply opening and the discharge opening of the vaporization vessel are connected to the outlet and the inlet of the coolant flow path, respectively.

7. A cooling method of cooling a coolant, the cooling method comprising:
　supplying the coolant into a vaporization vessel having therein a space;
　determining whether a pressure difference between a vapor pressure of the coolant and a vapor pressure of a first fluid is higher than a predetermined value;
　mixing the first fluid having the vapor pressure higher than the vapor pressure of the coolant with the coolant in the vaporization vessel if the pressure difference is higher than the predetermined value;
　mixing a second fluid having a vapor pressure higher than the vapor pressure of the first fluid with the coolant in the vaporization vessel if the pressure difference is equal to or lower than the predetermined value; and
　controlling an internal pressure within the vaporization vessel to be higher than the vapor pressure of the coolant and equal to or lower than the vapor pressure of the first fluid or the vapor pressure of the second fluid.

* * * * *

UNITED STATES PATENT AND TRADEMARK OFFICE
CERTIFICATE OF CORRECTION

PATENT NO. : 9,200,826 B2
APPLICATION NO. : 13/774122
DATED : December 1, 2015
INVENTOR(S) : Sasaki It is certified that error appears in the above-identified patent and that said Letters Patent is hereby corrected as shown below:

In the specification

Column 6, line 27, replace "62" with -- 82 --

Column 7, line 45, replace "30°C.," with -- 80°C., --

Column 8, line 16, replace "30" with -- 90 --

Column 9, line 24, replace "15 m" with -- 1.5 m --

Signed and Sealed this
Sixteenth Day of August, 2016

Michelle K. Lee
*Director of the United States Patent and Trademark Office*